(12) United States Patent
Tomasini et al.

(10) Patent No.: US 6,525,602 B1
(45) Date of Patent: Feb. 25, 2003

(54) INPUT STAGE FOR A BUFFER WITH NEGATIVE FEED-BACK

(75) Inventors: Luciano Tomasini, Milan (IT); Jesus Guinea, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/684,929

(22) Filed: Oct. 6, 2000

(30) Foreign Application Priority Data

Oct. 8, 1999 (EP) ............................................ 99830632

(51) Int. Cl.[7] ................................................ G06G 7/12
(52) U.S. Cl. ...................... 327/562; 327/108; 327/363; 330/265; 330/270; 330/278
(58) Field of Search ................ 327/108–112, 560–563, 327/345, 362, 363, 538, 552, 53, 54; 330/262–265, 269, 270, 271, 277, 282, 288, 310; 307/412; 326/82–87

(56) References Cited

U.S. PATENT DOCUMENTS 5,926,060 A * 7/1999 Olgaard et al. ............. 327/538
5,973,563 A * 10/1999 Seven ........................ 330/265
6,259,280 B1 * 7/2001 Koelling ..................... 327/53

OTHER PUBLICATIONS

Fisher et al., "A Highly Linear CMOS Buffer Amplifier,", IEEE, Journal of Solid State Circuits SC–22(3): 330–334, 1987.*

Nishio et al., "A Gyrator Constructed by CCII with Variable Current Transfer Ratio," IEEE, 1985, pp. 93–96.

Fisher and Koch, "A Highly Linear CMOS Buffer Amplifier," IEEE Journal of Solid–State Circiuts SC–22(3):330–334, 1987.

Piovaccan, "CMOS Integrated Third–Generation Current Conveyor," Electronics Letters 31:1228–1229, 1995.

* cited by examiner

Primary Examiner—Timothy P. Callahan
Assistant Examiner—Minh Nguyen
(74) Attorney, Agent, or Firm—Lisa K. Jorgenson; Dennis M. de Guzman; Seed IP Law Group PLLC

(57) ABSTRACT

An amplifier stage for a buffer with negative feedback includes an input stage having an input terminal, an output terminal, a first and a second supply terminal, a biasing branch, a first and a second balancing branch each comprising an active transistor for supplying, at the output terminal, a current depending on the current difference in the first and second balancing branches. The biasing branch and the first and second balancing branches are connected in parallel between the first and second supply terminals. The input terminal divides the biasing branch into two input branches having a constant-current generator. Each active transistor is connected to a corresponding current generator for receiving a control voltage correlated with a voltage at the terminals of the current generator.

23 Claims, 3 Drawing Sheets

INPUT STAGE FOR A BUFFER WITH NEGATIVE FEED-BACK

TECHNICAL FIELD

The present invention relates to an input stage for a buffer with negative feedback.

BACKGROUND OF THE INVENTION

Buffers are used in various applications, for example for driving electronic devices supplying high output currents. A particular type of buffer is formed with an operational amplifier with negative feedback. Typically, the operational amplifier is formed by a differential input stage (having a generator for producing a constant biasing current) cascade connected with an output stage.

A disadvantage of this structure is that it has a fairly low slew rate; this reduces the maximum frequency of an input signal which can be reproduced as an output without distortion. The slew rate is limited basically by the need to charge (by means of the biasing current, which has a low value) a compensating capacitor connected to the output stage for negative feedback.

A different known solution consists of the use of an input stage with a crossed structure constituted by two balancing branches and by two biasing branches connected in parallel between two supply terminals. This enables a biasing current of low value to be used and at the same time enables the current supplied to the compensating capacitor during a transient phenomenon to be increased at will, consequently reducing the time taken to charge the capacitor.

However, this solution requires a fairly complex structure. The operational amplifier thus produced also has high noise and a high input offset voltage. Moreover, this structure cannot be used with a low supply voltage to the operational amplifier.

SUMMARY OF THE INVENTION

An embodiment of the present invention overcomes the above-mentioned drawbacks by employing an input stage for a buffer with negative feedback. The input stage includes an input terminal, an output terminal, a first and a second supply terminal, a biasing branch, a first and a second balancing branch each comprising an active transistor for supplying, at the output terminal, a current depending on the current difference in the first and second balancing branches. The biasing branch and the first and second balancing branches are connected in parallel between the first and second supply terminals. The input terminal divides the biasing branch into two input branches each comprising a constant-current generator. Each active transistor is connected to a corresponding current generator for receiving a control voltage correlated with a voltage at the terminals of the current generator.

Another embodiment of the present invention proposes a buffer with negative feedback comprising this input stage.

BRIEF DESCRIPTION OF THE DRAWINGS

Further characteristics and the advantages of the input stage for a buffer with negative feedback according to the present invention will become clear from the following description of a preferred embodiment thereof, given by way of non-limiting example, with reference to the appended drawings.

DETAILED DESCRIPTION OF THE INVENTION

Figure 1:
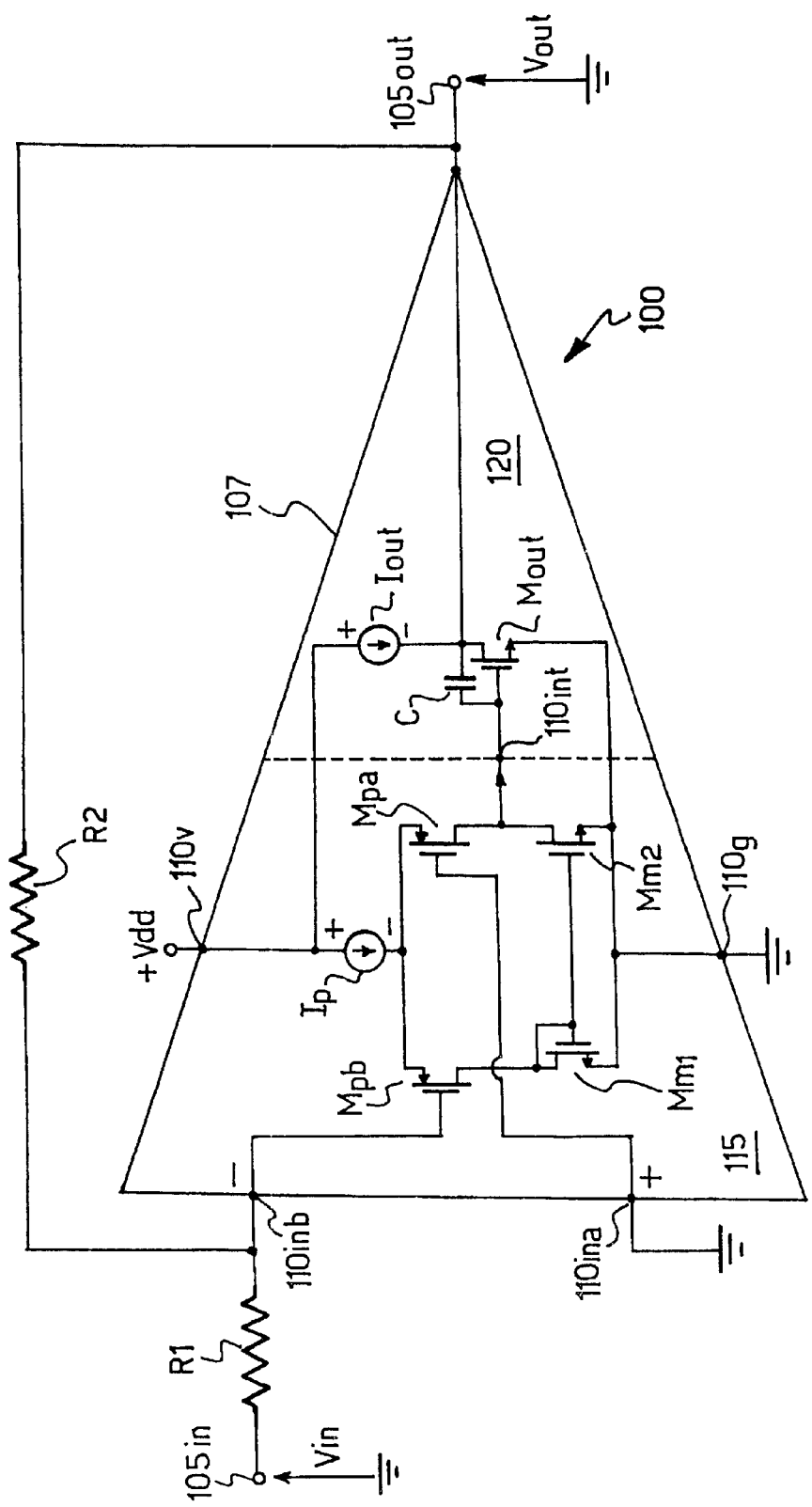
FIG. 1 shows a known operational-amplifier buffer.

With reference in particular to FIG. 1, this shows a known buffer 100 having an input terminal 105in (to which an input signal Vin, relative to a reference terminal or ground, is applied) and an output terminal 105out (which produces an output signal Vout, relative to the ground terminal). The buffer 100 is constituted by an operational amplifier 107 connected with negative feedback.

In particular, the operational amplifier 107 has a non-inverting (+) input terminal 110ina, an inverting (−) input terminal 110inb, an output terminal (connected directly to the terminal 105out) and two supply terminals 110g and 110v. The terminal 110g is connected to the ground terminal and the terminal 110v is connected to the positive terminal of a direct-current supply +Vdd, the negative terminal of which is connected to the ground terminal. The terminal 110ina is connected to the ground terminal. A resistor R1 is connected between the terminal 105in and the terminal 110inb; a further resistor R2 is connected between the terminal 110inb and the terminal 105out.

The operational amplifier 107 is constituted by an input stage 115 and an output stage 120 cascade connected between the input terminals 110ina, 110inb and the output terminal 105out. The input stage has two input terminals connected directly to the terminals 110ina and 110inb and an internal output terminal 110int (connected to the output stage 120).

The input stage 115 comprises two p-channel MOSFET transistors Mpa and Mpb having respective gate terminals connected to the non-inverting input terminal 110ina and to the inverting input terminal 110inb, respectively (so as to ensure a very high, theoretically infinite, input resistance of the operational amplifier 107). A source terminal of each transistor Mpa, Mpb is connected to a negative terminal (−) of a generator Ip for producing a constant biasing current (formed by MOSFET transistors), of which a positive terminal (+) is connected to the supply terminal 110v. Respective drain terminals of the transistors Mpa and Mpb are connected, respectively, to an output branch and to an input branch of a current mirror formed by two n-channel MOSFET transistors Mm1 and Mm2.

In particular, the transistor Mm1 has a drain terminal short-circuited to its own gate terminal, which is connected to the drain terminal of the transistor Mpb; a source terminal of the transistor Mm1 is connected to the supply terminal 110g. The transistor Mm2 has a source terminal connected to the supply terminal 110g, a gate terminal connected to the gate terminal of the transistor Mm1, and a drain terminal connected to the drain terminal of the transistor Mpa; the drain terminal of the transistor Mm2 is also connected to the internal output terminal 110int.

The output stage 120 comprises an n-channel MOSFET power transistor Mout. The transistor Mout has a source terminal connected to the supply terminal 110g, a gate terminal connected to the internal output terminal 110int, and a drain terminal connected to a negative terminal (−) of a generator Iout for producing a constant biasing current, a positive terminal (+) of which is connected to the supply terminal 110v; the drain terminal of the transistor Mout is also connected to the output terminal 105out (so as to ensure a very low, theoretically zero output resistance of the operational amplifier 107). A frequency compensating capacitor C is connected between the drain terminal and the gate terminal of the transistor Mout.

In a condition of equilibrium at the input terminals 110ina and 110inb (upon the assumption that the input stage 115 is perfectly symmetrical) a current equal to half of the biasing current (indicated below by the symbol Ip used to identify the corresponding current generator in the drawing) flows in each transistor Mpa, Mpb; this current is mirrored by the structure Mm1–Mm2 so that there is a zero current at the internal output terminal 110int.

It is now assumed that an input signal Vin is applied, for example, so as to bring the inverting input terminal 110inb to a potential higher than that of the non-inverting input 110ina. In this situation, the current through the transistor Mpb decreases to a value (Ip/2)–ΔI, whilst the current through the transistor Mpa correspondingly increases to a value (Ip/2)+ΔI. The difference 2·ΔI between the current (Ip/2)+ΔI (through the transistor Mpa) and the current (Ip/2)–ΔI (mirrored by the structure Mm1–Mm2) flows through the internal output terminal 110int. This current controls the output stage 120 which generates a corresponding output signal Vout (of negative value).

The current at the internal output terminal 110int (which is used to charge the compensating capacitor C during a switching of the operational amplifier 107) is limited by the value of the biasing current Ip. In fact, when the potential difference between the input terminals 110ina and 110inb exceeds a threshold value, one of the transistors Mpa, Mpb becomes non-conductive and the biasing current Ip flows entirely in the other transistor. The maximum value of the current at the internal output terminal 110int is thus equal to the biasing current Ip. This current cannot be increased beyond a certain limit since it contributes to the determination of the differential transconductance (gm) of the transistors Mpa, Mpb and hence of the pass-band of the operational amplifier 107.

Figure 2:
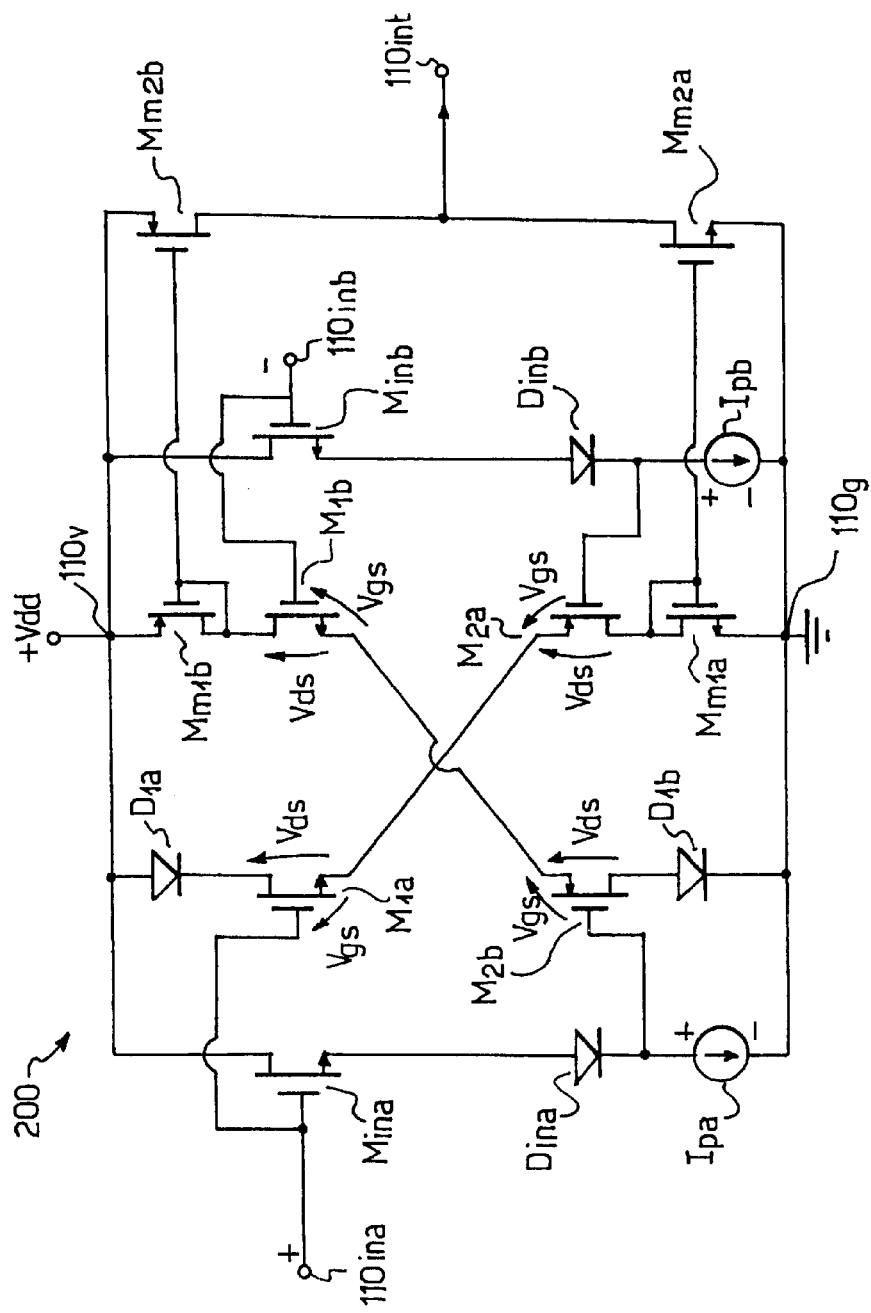
FIG. 2 shows a different known input stage for the operational amplifier.

With reference now to FIG. 2 (elements corresponding to those shown in the previous drawing are identified by the same reference numerals or symbols and an explanation thereof is omitted to simplify the description), this shows a different known input stage 200 with a crossed structure. The input stage 200 has two input branches connected between the supply terminals 110g and 110v. Each input branch is constituted by an n-channel MOSFET transistor Mna, Mnb, having a gate terminal connected to a respective input terminal 110ina, 110inb; a drain terminal of each transistor Mna, Mnb is connected to the supply terminal 110v and a source terminal of each transistor Mna, Mnb is connected to an anode terminal of a respective diode Dina, Dinb (formed by a MOSFET transistor having a drain terminal short-circuited to a gate terminal). A cathode terminal of each diode Dina, Dinb is connected to a positive terminal (+) of a respective constant biasing-current generator Ipa, Ipb, of which a negative terminal (–) is connected to the supply terminal 110g; typically, the constant-current generators Ipa and Ipb supply substantially equal currents.

The input stage 200 comprises two balancing branches connected between the supply terminals 110g and 110v. One of the balancing branches is constituted by a diode D1a having an anode terminal connected to the supply terminal 110v. A cathode terminal of the diode D1a is connected to a drain terminal of an n-channel MOSFET transistor M1a of which a gate terminal is connected to the gate terminal of the transistor Mna. A source terminal of the transistor M1a is connected to a source terminal of a p-channel MOSFET transistor M2a of which a gate terminal is connected to the cathode terminal of the diode Dinb. A drain terminal of the transistor M2a is connected to an input branch of a current mirror (relative to the supply terminal 110g) formed by two n-channel MOSFET transistors Mm1a and Mm2a, of which an output branch is connected to the internal output terminal 110int.

The other balancing branch is constituted, in complementary manner, by a diode D1b having a cathode terminal connected to the supply terminal 110g. An anode terminal of the diode D1b is connected to a drain terminal of a p-channel MOSFET transistor M2b, of which a gate terminal is connected to the cathode terminal of the diode Dina. A source terminal of the transistor M2b is connected to a source terminal of an n-channel MOSFET transistor M1b of which a gate terminal is connected to the gate terminal of the transistor Mnb. A drain terminal of the transistor M1b is connected to an input branch of a current mirror (relative to the supply terminal 110v) formed by two p-channel MOSFET transistors Mm1b and Mm2b of which an output branch is connected to the internal output terminal 110int.

The current in the balancing branches D1a–Mm1a and Mm1b–D1b is defined by a control voltage Vgs between the gate terminals and the source terminals of the transistors M1a, M2a and M1b, M2b, respectively (the transistors Mm1a and Mm1b being connected as diodes). The total voltage Vgs of the transistors M1a, M2a is equal to the voltage between the non-inverting input 110ina and the positive terminal of the current generator Ipb; similarly, the total voltage Vgs of the transistors M1b, M2b is equal to the voltage between the inverting input terminal 110inb and the positive terminal of the current generator Ipa.

In a condition of equilibrium at the input terminals 110ina and 110inb (upon the assumption that the input stage 200 is perfectly symmetrical), equal currents flow in the balancing branches D1a–Mm1a and Mm1b–D1b; these currents are mirrored by the structures Mm1a–Mm2a and Mm1b–Mm2b, respectively, so that there is a zero current at the internal output terminal 110int.

It is now assumed that an input signal is applied, for example, so as to increase the potential of the inverting input terminal 110inb, so that the potential of the positive input terminal of the current generator Ipb also increases by the same value. In this situation, the total voltage Vgs of the transistors M1b, M2b increases and the total voltage Vgs of the transistors M1a, M2a decreases by this value, so that the current in the balancing branch Mm1b–D1b increases and the current in the balancing branch D1a–Mm1a correspondingly decreases. The difference between the currents in the balancing branches Mm1b–D1b and D1a–Mm1a (mirrored by the structures Mm1b–Mm2b and Mm1a–Mm2a, respectively) flows through the internal output terminal 110int.

The current at the internal output terminal 110int (which is used to charge the compensating capacitor during the switching of the operational amplifier) is limited by the maximum value of the current in one of the balancing branches D1a–Mm1a, Mm1b–D1b (with a zero current in the other balancing branch). With reference, for example, to the balancing branch D1a–Mm1a (similar remarks apply to the balancing branch Mm1b–D1b), the maximum value of the current is defined by a total voltage Vds between the drain terminals and the source terminals of the transistors M1a, M2a, which is equal to the supply voltage +Vdd minus a threshold voltage of the diode D1a and of the diode formed by the transistor Mm1a (typically of the order of 1–1.5V).

As a result of this limitation, it is impossible to use the structure described above with a supply voltage +Vdd of low value (for example, below 4V). Moreover, the input stage 200 described above requires a large number of transistors and thus involves the occupation of a considerable space when produced in integrated form in a chip of semiconductor material, as well as having high noise and a high input offset voltage.

Figure 3:
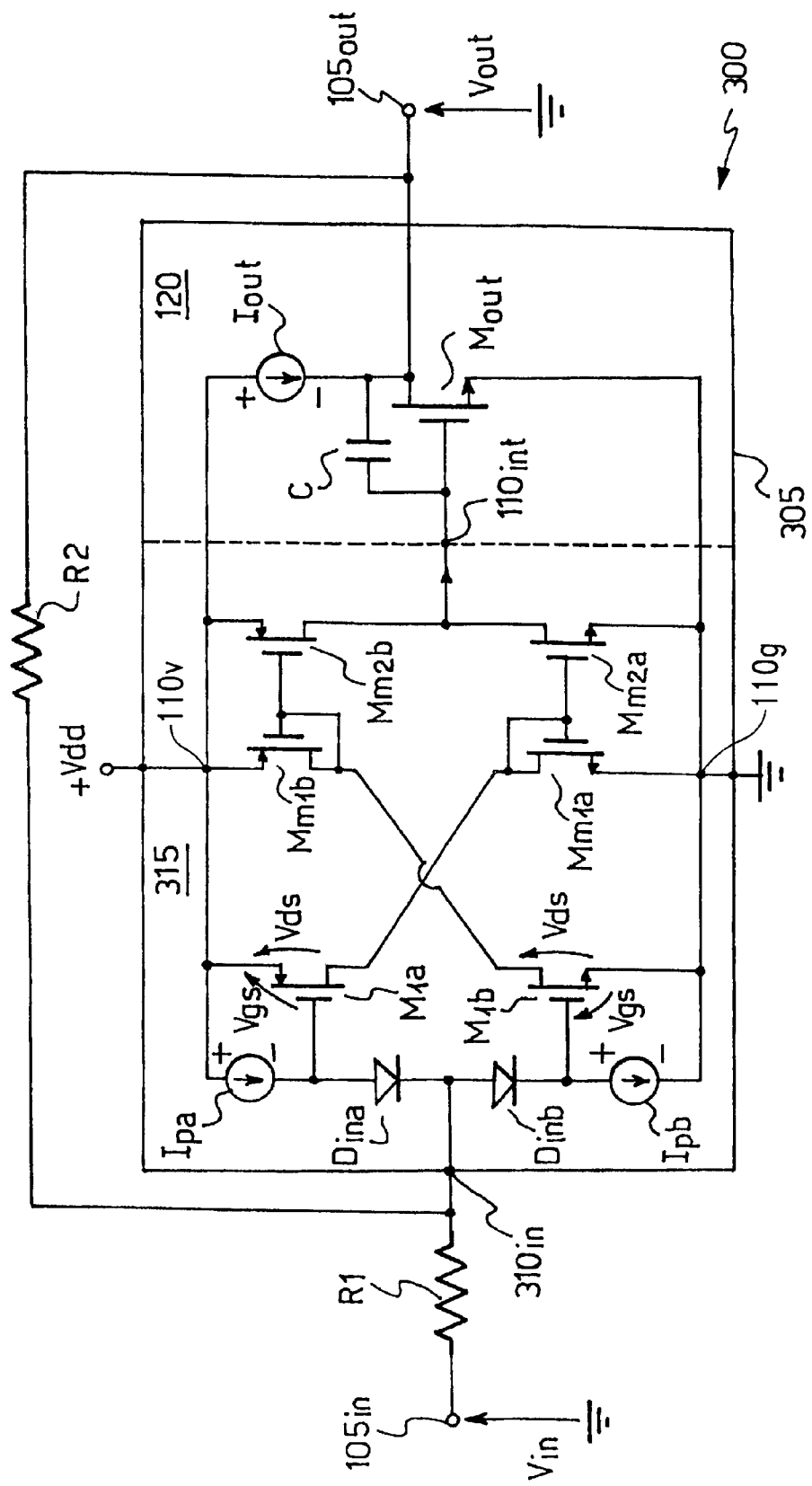
FIG. 3 is a basic circuit diagram of a buffer comprising an input stage according to an embodiment of the invention.
Figure 3:
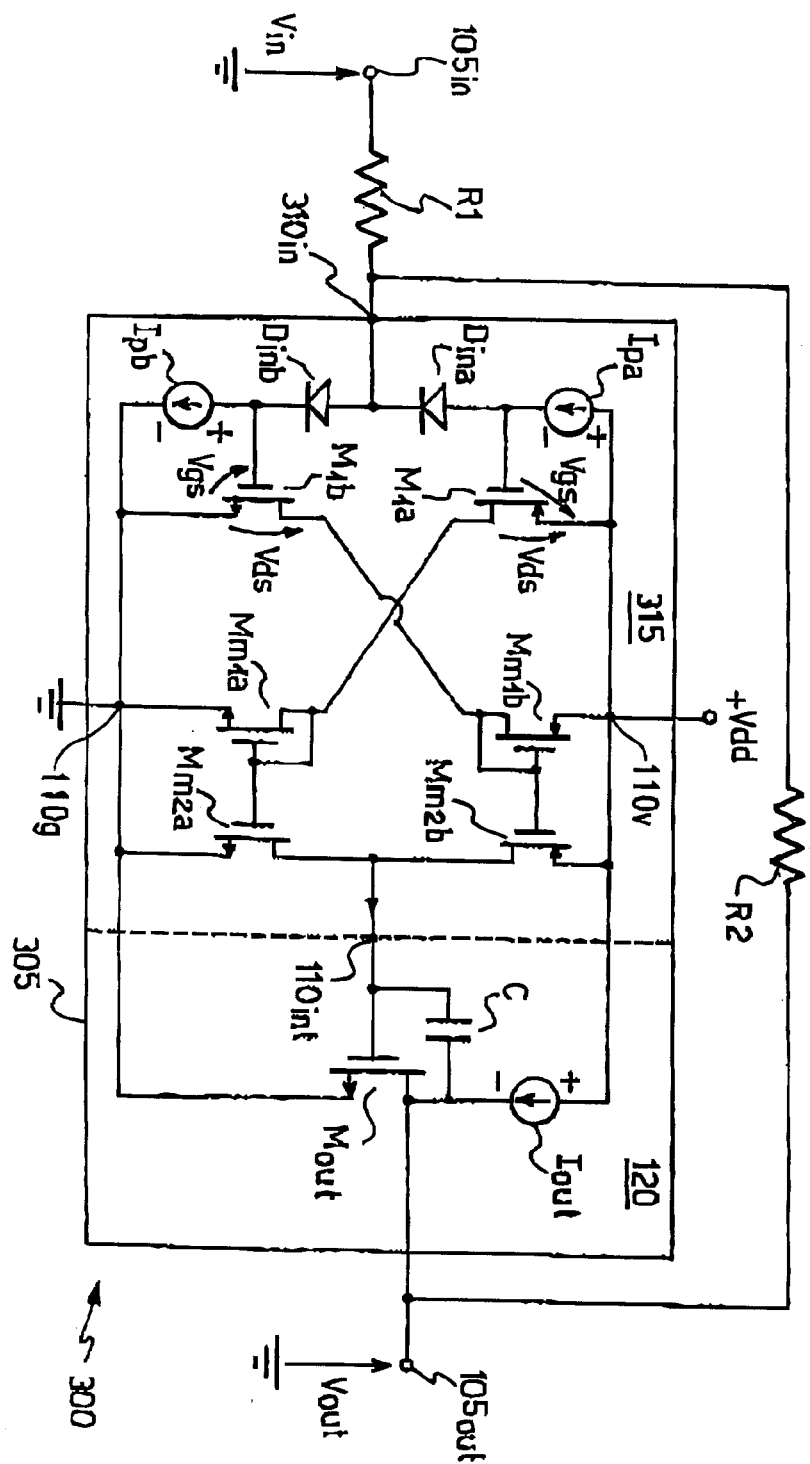

With reference now to FIG. 3 (elements corresponding to those shown in the previous drawings are indicated by the same reference numerals or symbols and an explanation thereof is omitted to simplify the description), this shows a negative-feedback buffer 300 formed by an amplifier 305; the amplifier 305 has a single input terminal 310in (to which the resistors R1 and R2 are connected).

The amplifier 305 is formed by an input stage 315 cascade connected with the output stage 120 between the input terminal 310in and the output terminal 105out. The input stage comprises a single biasing branch and two balancing branches, connected in parallel between the supply terminals 110g and 110v. The input terminal 310in is connected directly to a central node of the biasing branch so as to divide it into two input branches; each input branch is constituted by the respective current generator Ipa, Ipb connected in series with the respective diode Dina, Dinb. In particular, the positive terminal of the current generator Ipa is connected to the supply terminal 110v; the negative terminal of the current generator Ipa is connected to the anode terminal of the diode Dina, the cathode terminal of which is connected to the input terminal 310in. In complementary manner, the anode terminal of the diode Dinb is connected to the input terminal 310in; the cathode terminal of the diode Dinb is connected to the positive terminal of the current generator Ipb, the negative terminal of which is connected to the supply terminal 110g.

Each balancing branch is constituted purely by the respective transistor M1a, M1b (which operates as the active transistor of the balancing branch) and by the respective transistor Mm1a, Mm1b (which forms the respective current mirror Mm1a–Mm2a, Mm1b–Mm2b). In particular, the transistor M1a has its source terminal connected to the supply terminal 110v (and hence also to the positive terminal of the current generator Ipa), its gate terminal connected to the negative terminal of the current generator Ipa, and its drain terminal connected to the drain terminal of the transistor Mm1a; in complementary manner, the transistor M1b has its source terminal connected to the supply terminal 110g (and hence also to the negative terminal of the current generator Ipb), its gate terminal connected to the positive terminal of the current generator Ipb, and its drain terminal connected to the drain terminal of the transistor Mm1b.

Upon the assumption that the circuit is perfectly symmetrical, the current generators Ipa, Ipb ensure that the current in the input branch Ipa-Dina is equal to the current in the input branch Dinb-Ipb; the current at the input terminal 310in is therefore zero and the amplifier 305 thus has a theoretically infinite input resistance (whereas the output resistance of the amplifier 305 is theoretically zero).

The current in the balancing branches M1a–Mm1a and Mm1b–M1b is defined by the control voltage Vgs between the gate terminals and the source terminals of the transistors M1a and M1b, respectively, (the transistors Mm1a and Mm1b being connected as diodes). The voltages Vgs of the transistors M1a and M1b are equal to the voltages at the terminals of the current generator Ipa and of the current generator Ipb, respectively; the diodes Dina, Dinb ensure that the voltages Vgs of the transistors M1a, M1b have the correct values.

In a condition of equilibrium (in the absence of an input signal Vin), the voltages at the terminals of the current generators Ipa and Ipb, and hence also the voltage Vgs of the transistors M1a and M1b, are equal; equal currents therefore flow in the balancing branches M1a–Mm1a and Mm1b–M1b; these currents are mirrored by the structures Mm1a–Mm2a and Mm1b–Mm2b, respectively, so that there is a zero current at the internal output terminal 110int.

It is now assumed that an input signal Vin is applied, for example, so as to increase the potential of the input terminal 310in. In this situation, the voltage at the terminals of the current generator Ipb (and hence also the voltage Vgs of the transistor M1b) increases and the voltage at the terminals of the current generator Ipa (and hence also the voltage Vgs of the transistor M1a) decreases by the same value. The current in the balancing branch M1b–Mm1b consequently increases and the current in the balancing branch Mm1a–M1a correspondingly decreases. The difference between the currents in the balancing branches M1b–Mm1b and Mm1a–M1a (mirrored by the structures Mm1b–Mm2b and Mm1a–Mm2a, respectively) flows in the internal output terminal 110int. This current controls the output stage 120 which generates the corresponding output signal Vout (of negative value). The signal Vout, fed back by the resistor R2, tends to bring the input terminal 310in back to the equilibrium condition.

Similar remarks apply if the current mirrors have a different structure or, more generally, if other equivalent means are provided for supplying, at the internal output terminal, a current depending on the current difference in the two balancing branches, or if a different number of diodes (or even none) is provided, if the active transistors of the balancing branches are connected to the corresponding current generators in a different manner (so as to receive a control voltage generally correlated with the voltage at the terminals of the current generator), if the diodes and the constant-current generators are formed differently, if the n-channel transistors are replaced by p-channel transistors and vice versa, or if bipolar transistors are used, etc.

The input stage of the present invention enables a low supply voltage, for example, of 3.3V or 2.5 V to be used. In fact, with reference to the embodiment shown in the drawing, the maximum value of the current in the balancing branch M1a–Mm1a (similar remarks apply to the balancing branch Mm1b–M1b) is defined by the voltage Vds of the transistor M1a which is equal to the supply voltage +Vdd minus the threshold voltage of the diode formed by the transistor Mm1a. This permits the use of a supply voltage 2–3V lower than the known input stage described above, for a given maximum current value.

This result is achieved by an extremely simple structure (which requires a small number of transistors) and which therefore occupies a small space on the chip of semiconductor material when produced in integrated form.

Moreover, the input stage has good immunity to noise and has a low input offset voltage.

Naturally, in order to satisfy contingent and specific requirements, an expert in the art may apply to the above-described input stage for a buffer with negative feedback many modifications and variations all of which, however, are included within the scope of protection of the invention as defined by the following claims.

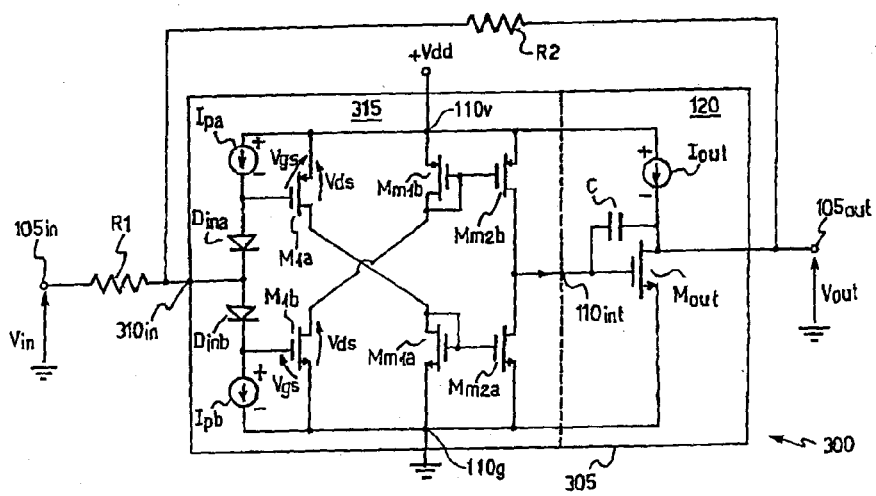

We claim:

1. An amplifier stage for a buffer with negative feedback, the amplifier stage including an input stage and an output stage coupled to the input stage, the input stage comprising an input terminal, an output terminal, a first and a second supply terminal, a biasing branch, a first and a second balancing branch each comprising an active transistor in an amplification configuration for supplying, at the output terminal, a current depending on a current difference in the first and second balancing branches, the biasing branch and the first and second balancing branches being connected in parallel between the first and second supply terminals, wherein the input terminal divides the biasing branch into first and second input branches each comprising a constant-current generator, the active transistor being connected to a corresponding one of the constant-current generators and receiving a corresponding control voltage correlated with a voltage at the terminals of the corresponding constant-current generator.

2. An amplifier stage according to claim 1 wherein each input branch further comprises at least one diode connected in series with the corresponding constant-current generator.

3. An amplifier stage according to claim 2 wherein each active transistor has a first terminal, a second terminal, and a control terminal, the corresponding control voltage being equal to the voltage between the first terminal and the control terminal, and wherein the active transistor is connected to its respective balancing branch by means of the first and second terminals, the first terminal and the control terminal of the active transistor being connected to respective corresponding terminals of the constant-current generator.

4. An amplifier stage according to claim 3 wherein the active transistor of the first balancing branch has a first polarity and the first terminal of the active transistor of the first balancing branch is connected to the first supply terminal, and the active transistor of the second balancing branch has a second polarity, opposite to the first polarity, and the first terminal of the active transistor of the second balancing branch is connected to the second supply terminal, wherein in the first input branch, the constant-current generator having a first terminal connected to the first supply terminal and a second terminal connected to an anode terminal of the at least one diode of the first input branch, the at least one diode of the first input branch having a cathode terminal connected to the input terminal, and wherein in the second input branch, the at least one diode having an anode terminal connected to the input terminal and a cathode terminal connected to a first terminal of the constant-current generator of the second input branch, the constant-current generator of the second input branch having a second terminal connected to the second supply terminal.

5. An amplifier stage according to claim 4, further comprising, for each balancing branch, a current mirror having an input branch connected to the balancing branch and an output branch connected to the output terminal.

6. An amplifier stage according to claim 5 in which each current mirror includes a first and a second transistor having an opposite polarity to the polarity of the corresponding active transistor, the first transistor having a control terminal, a first terminal connected to the second terminal of the active transistor of the balancing branch that includes the current mirror, and a second terminal connected to one of the supply terminals other than the supply terminal which is connected to the first terminal of the active transistor, and the second transistor having a first terminal, a control terminal, and a second terminal connected, respectively, to the other supply terminal, to the control terminal of the first transistor, and to the output terminal.

7. An amplifier stage according to claim 4 in which the active transistor having the first polarity is a p-channel MOSFET transistor and the active transistor having the second polarity is an n-channel MOSFET transistor, the first terminal, the second terminal and the control terminal of each active transistor being a source terminal, a drain terminal and a gate terminal, respectively, and in which the second supply terminal is a reference terminal and the first supply terminal is a supply terminal which is positive relative to the reference terminal.

8. A buffer with negative feedback, the buffer comprising:

an amplifier stage having an input stage, the input stage comprising an input terminal, an output terminal, a first and a second supply terminal, a biasing branch, a first and a second balancing branch each comprising an active transistor in an amplification configuration for supplying, at the output terminal, a current depending on a current difference in the first and second balancing branches, the biasing branch and the first and second balancing branches being connected in parallel between the first and second supply terminals, wherein the input terminal divides the biasing branch into first and second input branches each comprising a constant-current generator, the active transistor being connected to a corresponding one of the constant-current generators and receiving a corresponding control voltage correlated with a voltage at the terminals of the corresponding constant-current generator; and a buffer input terminal and a buffer output terminal, a first resistor connected between the input terminal of the buffer and the input terminal of the amplifier stage, an output stage connected between the output terminal of the amplifier stage and the output terminal of the buffer, and a second resistor connected between the input terminal of the input stage and the output terminal of the buffer.

9. A buffer, comprising:

an input terminal and an output terminal;

first and second supply terminals;

a first balancing branch connected between the first and second supply terminals and including a first balancing transistor in an amplification configuration and having a control terminal and first and second conduction terminals;

a second balancing branch connected in parallel with the first balancing branch between the first and second supply terminals and including a second balancing transistor in an amplification configuration and having a control terminal and first and second conduction terminals, wherein the first and second balancing branches include first and second mirror transistors, respectively;

a first input branch coupled between the input terminal and the first supply terminal, the first input branch including a first constant-current generator coupled between the control and first conduction terminals of the first balancing transistor;

a second input branch coupled between the input terminal and the second supply terminal, the second input branch including a second constant-current generator coupled between the control and second conduction terminals of the second balancing transistor;

a third mirror transistor forming a first current mirror with the first mirror transistor and a fourth mirror transistor forming a second current mirror with the second mirror transistor, the third and fourth mirror transistors being connected to each other between the first and second supply terminals; and an output transistor having a control terminal and a conduction terminal, the control terminal of the output transistor being coupled to a node connecting the third and fourth mirror transistors to each other, and the conduction terminal of the output transistor being coupled to the output terminal.

10. The buffer of claim 9 wherein the first input branch includes a first diode connected in series with the first constant-current generator and the second input branch includes a second diode connected in series with the second constant-current generator.

11. The buffer of claim 9 wherein the first balancing transistor has a first polarity; the first terminal of the first balancing transistor is connected to the first supply terminal; the second balancing transistor has a second polarity, opposite to the first polarity; and the second terminal of the second balancing transistor is connected to the second supply terminal.

12. The buffer of claim 9 wherein the first balancing transistor and the second mirror transistor are PMOS transistors and the second balancing transistor and first mirror transistor are NMOS transistors, and wherein the second supply terminal is a reference terminal and the first supply terminal is positive relative to the reference terminal.

13. The buffer of claim 9, further comprising a feedback resistor connected between the input and output terminals.

14. A buffer, comprising:

an input terminal and an output terminal;

first and second supply terminals;

a first balancing branch connected between the first and second supply terminals and including a first balancing transistor having a control terminal and first and second conduction terminals;

a second balancing branch connected in parallel with the first balancing branch between the first and second supply terminals and including a second balancing transistor having a control terminal and first and second conduction terminals, wherein the first and second balancing branches include first and second mirror transistors, respectively;

a first diode connected between the input terminal and the control terminal of the first balancing transistor;

a second diode connected between the input terminal and the control terminal of the second balancing transistor;

a feedback resistor connected between the input and output terminals;

a third mirror transistor forming a first current mirror with the first mirror transistor and a fourth mirror transistor forming a second current mirror with the second mirror transistor, the third and fourth mirror transistors being connected to each other between the first and second supply terminals; and an output transistor having a control terminal and a conduction terminal, the control terminal of the output transistor being coupled to a node connecting the third and fourth mirror transistors to each other, and the conduction terminal of the output transistor being coupled to the output terminal.

15. The buffer of claim 14, further comprising:

a first constant-current generator coupled between the control and first conduction terminals of the first balancing transistor; and a second constant-current generator coupled between the control and second conduction terminals of the second balancing transistor.

16. The buffer of claim 14 wherein the first balancing transistor has a first polarity; the first terminal of the first balancing transistor is connected to the first supply terminal; the second balancing transistor has a second polarity, opposite to the first polarity; and the second terminal of the second balancing transistor is connected to the second supply terminal.

17. The buffer of claim 14 wherein the first balancing transistor and the second mirror transistor are PMOS transistors and the second balancing transistor and first mirror transistor are NMOS transistors, and wherein the second supply terminal is a reference terminal and the first supply terminal is positive relative to the reference terminal.

18. An input stage for a buffer with negative feedback, the input stage comprising:

an input terminal, an output terminal, a first and a second supply terminal, a biasing branch, a first and a second balancing branch each comprising an active transistor for supplying, at the output terminal, a current depending on a current difference in the first and second balancing branches, the biasing branch and the first and second balancing branches being connected in parallel between the first and second supply terminals;

wherein the input terminal divides the biasing branch into first and second input branches each comprising a constant-current generator, the active transistor being connected to a corresponding one of the constant-current generators and receiving a corresponding control voltage correlated with a voltage at the terminals of the corresponding constant-current generator;

wherein each input branch further comprises at least one diode connected in series with the corresponding constant-current generator;

wherein each active transistor has a first terminal, a second terminal, and a control terminal, the corresponding control voltage being equal to the voltage between the first terminal and the control terminal, and wherein the active transistor is connected to its respective balancing branch by means of the first and second terminals, the first terminal and the control terminal of the active transistor being connected to respective corresponding terminals of the constant-current generator;

wherein the active transistor of the first balancing branch has a first polarity and the first terminal of the active transistor of the first balancing branch is connected to the first supply terminal, and the active transistor of the second balancing branch has a second polarity, opposite to the first polarity, and the first terminal of the active transistor of the second balancing branch is connected to the second supply terminal;

wherein in the first input branch, the constant-current generator having a first terminal connected to the first supply terminal and a second terminal connected to an anode terminal of the at least one diode of the first input branch, the at least one diode of the first input branch having a cathode terminal connected to the input terminal; and wherein in the second input branch, the at least one diode having an anode terminal connected to the input terminal and a cathode terminal connected to a first terminal of the constant-current generator of the second input branch, the constant-current generator of the second input branch having a second terminal connected to the second supply terminal.

19. The input stage of claim 18, further comprising, for each balancing branch, a current mirror having an input branch connected to the balancing branch and an output branch connected to the output terminal.

20. A buffer with negative feedback, the buffer comprising:

an input stage having an input terminal, an output terminal, a first and a second supply terminal, a biasing branch, a first and a second balancing branch each comprising an active transistor for supplying, at the output terminal, a current depending on a current difference in the first and second balancing branches, the biasing branch and the first and second balancing branches being connected in parallel between the first and second supply terminals, wherein the input terminal divides the biasing branch into first and second input branches each comprising a constant-current generator, the active transistor being connected to a corresponding one of the constant-current generators and receiving a corresponding control voltage correlated with a voltage at the terminals of the corresponding constant-current generator;

a buffer input terminal and a buffer output terminal;

a first resistor connected between the input terminal of the buffer and the input terminal of the input stage;

an output stage connected between the output terminal of the input stage and the output terminal of the buffer; and a second resistor connected between the input terminal of the input stage and the output terminal of the buffer.

21. A buffer, comprising:

an input terminal and an output terminal;

first and second supply terminals;

a first balancing branch connected between the first and second supply terminals and including a first balancing transistor having a control terminal and first and second conduction terminals;

a second balancing branch connected in parallel with the first balancing branch between the first and second supply terminals and including a second balancing transistor having a control terminal and first and second conduction terminals;

a first input branch coupled between the input terminal and the first supply terminal, the first input branch including a first constant-current generator coupled between the control and first conduction terminals of the first balancing transistor;

a second input branch coupled between the input terminal and the second supply terminal, the second input branch including a second constant-current generator coupled between the control and second conduction terminals of the second balancing transistor, wherein the first and second balancing branches include first and second mirror transistors, respectively;

a third mirror transistor forming a first current mirror with the first mirror transistor and a fourth mirror transistor forming a second current mirror with the second mirror transistor, the third and fourth mirror transistors being connected to each other between the first and second supply terminals; and an output transistor having a control terminal and a conduction terminal, the control terminal of the output transistor being coupled to a node connecting the third and fourth mirror transistors to each other, and the conduction terminal of the output transistor being coupled to the output terminal.

22. A buffer, comprising:

an input terminal and an output terminal;

first and second supply terminals;

a first balancing branch connected between the first and second supply terminals and including a first balancing transistor having a control terminal and first and second conduction terminals;

a second balancing branch connected in parallel with the first balancing branch between the first and second supply terminals and including a second balancing transistor having a control terminal and first and second conduction terminals;

a first diode connected between the input terminal and the control terminal of the first balancing transistor;

a second diode connected between the input terminal and the control terminal of the second balancing transistor, wherein the first balancing transistor and the second mirror transistor comprise PMOS transistors and the second balancing transistor and first mirror transistor comprise NMOS transistors, and wherein the second supply terminal is a reference terminal and the first supply terminal is positive relative to the reference terminal.

23. The buffer of claim 22 wherein the first and second balancing branches include first and second mirror transistors, respectively, the buffer further comprising:

a third mirror transistor forming a first current mirror with the first mirror transistor and a fourth mirror transistor forming a second current mirror with the second mirror transistor, the third and fourth mirror transistors being connected to each other between the first and second supply terminals; and an output transistor having a control terminal and a conduction terminal, the control terminal of the output transistor being coupled to a node connecting the third and fourth mirror transistors to each other, and the conduction terminal of the output transistor being coupled to the output terminal.

* * * * *

UNITED STATES PATENT AND TRADEMARK OFFICE
CERTIFICATE OF CORRECTION

PATENT NO. : 6,525,602 B1
DATED : February 25, 2003
INVENTOR(S) : Luciano Tomasini et al.

It is certified that error appears in the above-identified patent and that said Letters Patent is hereby corrected as shown below:

<u>Title page,</u>
Item [30], under Foreign Application Number should read -- 99830632.8 --.

The title page should be deleted and substitute therefore the attached title page.

Delete drawing sheet 3 of 3 and substitute therefore the drawing sheet, consisting of Fig. 3 as shown on the attached page.

Signed and Sealed this

Fifth Day of August, 2003

JAMES E. ROGAN
*Director of the United States Patent and Trademark Office*

(12) United States Patent  (10) Patent No.: US 6,525,602 B1
Tomasini et al.  (45) Date of Patent: Feb. 25, 2003

(54) INPUT STAGE FOR A BUFFER WITH NEGATIVE FEED-BACK

(75) Inventors: Luciano Tomasini, Milan (IT); Jesus Guinea, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/684,929

(22) Filed: Oct. 6, 2000

(30) Foreign Application Priority Data

Oct. 8, 1999 (EP) .............................................. 99830632

(51) Int. Cl.[7] .................................................. G06G 7/12
(52) U.S. Cl. ........................ 327/562; 327/108; 327/363; 330/265; 330/270; 330/278
(58) Field of Search ................. 327/108–112, 560–563, 327/345, 362, 363, 538, 552, 53, 54; 330/262–265, 269, 270, 271, 277, 282, 288, 310; 307/412; 326/82–87

(56) References Cited

U.S. PATENT DOCUMENTS 5,926,060 A  *  7/1999  Olgaard et al. ............. 327/538
5,973,563 A  *  10/1999  Seven ........................ 330/265
6,259,280 B1  *  7/2001  Koelling ..................... 327/53

OTHER PUBLICATIONS

Fisher et al., "A Highly Linear CMOS Buffer Amplifier,", IEEE, Journal of Solid State Circuits SC–22(3): 330–334, 1987.*

Nishio et al., "A Gyrator Constructed by CCII with Variable Current Transfer Ratio," *IEEE*, 1985, pp. 93–96.

Fisher and Koch, "A Highly Linear CMOS Buffer Amplifier," *IEEE Journal of Solid-State Circiuts* SC–22(3):330–334, 1987.

Piovaccan, "CMOS Integrated Third-Generation Current Conveyor," *Electronics Letters* 31:1228–1229, 1995.

* cited by examiner

*Primary Examiner*—Timothy P. Callahan
*Assistant Examiner*—Minh Nguyen
(74) *Attorney, Agent, or Firm*—Lisa K. Jorgenson; Dennis M. de Guzman; Seed IP Law Group PLLC

(57) ABSTRACT

An amplifier stage for a buffer with negative feedback includes an input stage having an input terminal, an output terminal, a first and a second supply terminal, a biasing branch, a first and a second balancing branch each comprising an active transistor for supplying, at the output terminal, a current depending on the current difference in the first and second balancing branches. The biasing branch and the first and second balancing branches are connected in parallel between the first and second supply terminals. The input terminal divides the biasing branch into two input branches having a constant-current generator. Each active transistor is connected to a corresponding current generator for receiving a control voltage correlated with a voltage at the terminals of the current generator.

23 Claims, 3 Drawing Sheets